(12) United States Patent
Yoshida et al.

(10) Patent No.: US 7,812,345 B2
(45) Date of Patent: Oct. 12, 2010

(54) ORGANIC EL DISPLAY PANEL

(75) Inventors: Hidehiro Yoshida, Osaka (JP); Kenji Okumoto, Kyoto (JP); Keisei Yamamuro, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/521,044

(22) PCT Filed: Jan. 30, 2009

(86) PCT No.: PCT/JP2009/000366
§ 371 (c)(1),
(2), (4) Date: Jun. 24, 2009

(87) PCT Pub. No.: WO2009/107323
PCT Pub. Date: Sep. 3, 2009

(65) Prior Publication Data
US 2010/0181554 A1   Jul. 22, 2010

(30) Foreign Application Priority Data
Feb. 28, 2008   (JP) .............................. 2008-047043

(51) Int. Cl.
H01L 35/24   (2006.01)
H01L 51/52   (2006.01)

(52) U.S. Cl. .......... 257/40; 257/E21.002; 257/E51.018; 257/E51.022

(58) Field of Classification Search .................... 257/40, 257/E21.002, E51.018, E51.022; 438/99
See application file for complete search history.

(56) References Cited
U.S. PATENT DOCUMENTS 7,112,823 B2 * 9/2006 Ishii et al. ..................... 257/80
7,229,704 B2 * 6/2007 Seki et al. .................... 428/690
7,235,415 B2 * 6/2007 Mikoshiba .................... 438/21
7,282,779 B2 * 10/2007 Hasei ......................... 257/520

(Continued)

FOREIGN PATENT DOCUMENTS

JP   5-47470   2/1993

(Continued)

OTHER PUBLICATIONS

Korean Office Action for Korean Patent Application No. 10-2009-7012715, dated Jan. 19, 2010.

(Continued)

*Primary Examiner*—Evan Pert
(74) *Attorney, Agent, or Firm*—Greenblum & Bernstein, P.L.C.

(57) ABSTRACT

The present invention relates to an organic EL display panel having an organic light emitting layer having a uniform film thickness. The organic EL display panel of the present invention includes: a substrate; linear banks placed on the substrate and defining a linear region on the substrate; and at least two organic EL elements aligned in a row each linear region, and, each of the organic EL elements includes: an anode placed on the substrate; a hole injection layer formed with an metallic oxide and placed on the anode; an organic light emitting layer placed on the hole injection layer; and a cathode placed on the organic light emitting layer. The hole injection layer is concavely curved or convexly curved, the hole injection layer is partly placed under the banks; and the organic light emitting layer is formed by applying an organic light emitting material in the linear region.

8 Claims, 11 Drawing Sheets

U.S. PATENT DOCUMENTS

| | | | |
|---|---|---|---|
| 7,410,905 B2 * | 8/2008 | Ushiyama et al. | 438/701 |
| 7,547,566 B2 * | 6/2009 | Ishii et al. | 438/29 |
| 7,605,535 B2 * | 10/2009 | Kobayashi | 313/506 |
| 2004/0189194 A1 | 9/2004 | Kihara et al. | |
| 2004/0222740 A1 | 11/2004 | Kim | |
| 2005/0029538 A1 | 2/2005 | Choi et al. | |
| 2005/0062412 A1 | 3/2005 | Taniguchi et al. | |
| 2005/0174041 A1 | 8/2005 | Li | |
| 2007/0241665 A1 | 10/2007 | Sakanoue et al. | |
| 2007/0290604 A1 | 12/2007 | Sakanoue et al. | |
| 2008/0024402 A1 | 1/2008 | Nishikawa et al. | |
| 2008/0290339 A1 | 11/2008 | Nakatani et al. | |
| 2009/0058268 A1 | 3/2009 | Yoshida et al. | |

FOREIGN PATENT DOCUMENTS

| | | |
|---|---|---|
| JP | 10-208875 | 8/1998 |
| JP | 10-223368 | 8/1998 |
| JP | 2002-170633 | 6/2002 |
| JP | 2003-264084 | 9/2003 |
| JP | 2004-47215 | 2/2004 |
| JP | 2004-127575 | 4/2004 |
| JP | 2004-234901 | 8/2004 |
| JP | 2004-335470 | 11/2004 |
| JP | 2005-174717 | 6/2005 |
| JP | 2005-174914 | 6/2005 |
| JP | 2005-222935 | 8/2005 |
| JP | 2006-252988 | 9/2006 |
| JP | 2006-253443 | 9/2006 |
| JP | 2007-505465 | 3/2007 |
| JP | 2007-288074 | 11/2007 |
| JP | 2007-335737 | 12/2007 |
| WO | 2005/107327 | 11/2005 |

OTHER PUBLICATIONS

English language Abstract of JP 2006-253443, Sep. 21, 2006.
English language Abstract of JP 2004-47215, Feb. 12, 2004.
English language Abstract of JP 2007-335737, Dec. 27, 2007.
English language Abstract of JP 2004-234901, Aug. 19, 2004.
English language Abstract of JP 2006-252988, Sep. 21, 2006.
English language Abstract of JP 2005-174914, Jun. 30, 2005.
English language Abstract of JP 2007-505465, Mar. 8, 2007.
English language Abstract of JP 2004-335470, Nov. 25, 2004.
English language Abstract of JP 2004-127575, Apr. 22, 2004.
English language Abstract of JP 2005-174717, Jun. 30, 2005.
English language Abstract of JP 10-223368, Aug. 21, 1998.
English language Abstract of JP 2003-264084, Sep. 19, 2003.
English language Abstract of JP 10-208875, Aug. 8, 1998.
English language Abstract of JP 5-47470, Feb. 26, 1993.
English language Abstract of JP 2005-222935, Aug. 8, 2005.

* cited by examiner

ORGANIC EL DISPLAY PANEL

TECHNICAL FIELD

The present invention relates to an organic EL display panel and a manufacturing method thereof.

BACKGROUND ART

An organic EL device, which is a display device, is a light emitting element exploiting electro-luminescence of organic compounds. An organic EL device has a cathode, an anode, and an electroluminescent organic light emitting layer provided between the electrodes. Organic light emitting layer can be roughly classified into two categories: the organic light emitting layer containing combinations of small molecular organic compounds (host material and dopant material) and the organic light emitting layer containing polymer. Examples of electro-luminescent polymer include polyphenylenevinylene (also referred to as PPV) and its derivatives. Organic EL devices using polymer can be driven with a relatively low voltage, consumes small power and is suitable for manufacturing a larger display panel, and therefore is presently studied actively.

In an organic EL display panel using organic EL devices, organic EL elements (sub pixels) are arranged in matrix form on the substrate. In an organic EL display panel, organic EL element emits red (R), green (G), or blue (B) light.

An organic light emitting layer containing polymer is formed by applying a polymer ink containing, for example, organic light emitting materials and solvents, to an anode with ink jet or the like. Therefore, when an ink that contains an organic light emitting material is applied to each sub pixel of an organic EL display panel, it is necessary to prevent ink from intruding into adjacent sub pixels.

As a method for preventing an ink from intruding into adjacent sub pixels, defining sub pixels by banks and applying an ink inside region defined by the banks, is known (e.g. see Patent Document 1).

Patent Document 1 discloses a method for preventing a polymer ink from intruding into adjacent sub pixels by providing banks defining each sub pixel and by dropping a polymer ink accurately on each sub pixel.

Further, a technique of making the surface of an anode curved in order to improve the light emission efficiency of the organic light emitting layer is known (e.g. see Patent Documents 2 to 17).

Patent Documents 2 to 4 disclose techniques for improving the viewing angle of an organic EL display, by forming a plurality of concave and convex shapes on the surface of an anode of organic EL element to make an organic light emitting layer concavo-convex.

Patent Documents 5 to 8 disclose techniques of enlarging a surface of an anode by forming fine concave and convex shapes on the surface of an anode of organic EL element to improve the light emission efficiency by increasing a current to supply to an organic light emitting layer.

Patent Document 9 discloses a technique for improving the efficiency of light emission of a pixel by forming concave parts and convex parts in an organic light emitting layer and by suppressing light emission from the convex parts.

Patent Documents 10 and 11 disclose techniques for efficiently utilizing light of the organic light emitting layer by making the organic light emitting layer concavely curved. Further, in Patent Documents 10 and 11, an organic light emitting layer is formed with the deposition method.

Patent Documents 12 to 14 disclose techniques for controlling direction of light by making an anode concavely curved and using an anode as a concave reflection mirror.

Further, in Patent Document 14, an organic light emitting layer is formed by the deposition method.

Patent Document 15 discloses a technique of forming an organic light emitting layer on a substrate having a curved surface and manufacturing a lighting apparatus.

Patent Documents 16 and 17 disclose techniques of forming a plurality of concave and convex shapes on a surface of an anode of organic EL element to reduce power consumption and to increase the aperture ratio.

Patent Document 1: Japanese Patent Application Laid-Open No. 2006-252988

Patent Document 2: International Publication Pamphlet No. 05/107327

Patent Document 3: U.S. Patent Application Publication No. 2008/0024402

Patent Document 4: Japanese Patent Application Laid-Open No. 2005-174914

Patent Document 5: Japanese Patent Application Laid-Open No. 2007-505465

Patent Document 6: U.S. Patent Application Publication No. 2005/0029538

Patent Document 7: Japanese Patent Application Laid-Open No. 2004-335470

Patent Document 8: U.S. Patent Application Publication No. 2004/0222740

Patent Document 9: Japanese Patent Application Laid-Open No. 2004-127575

Patent Document 10: Japanese Patent Application Laid-Open No. 2005-174717

Patent Document 11: Japanese Patent Application Laid-Open No. Hei 10-223368

Patent Document 12: Japanese Patent Application Laid-Open No. 2003-264084

Patent Document 13: U.S. Patent Application Publication No. 2005/0062412

Patent Document 14: Japanese Patent Application Laid-Open No. Hei 10-208875

Patent Document 15: Japanese Patent Application Laid-Open No. Hei 5-47470

Patent Document 16: Japanese Patent Application Laid-Open No. 2005-222935

Patent Document 17: U.S. Patent Application Publication No. 2005/0174041

DISCLOSURE OF INVENTION

Problems to be Solved by the Invention

As described in Patent Document 1, when an organic light emitting layer is formed by applying an ink inside region defined by banks, a problem occurs that the thickness of the light emitting-layer becomes non-uniform. FIG. 1 shows the shape of an organic light emitting layer formed by applying an ink inside a region defined by banks and by drying the applied ink.

As shown in FIG. 1, the ink is attracted to banks 107 in the process of drying the ink. As a result, cases occur where the center part of formed organic light emitting layer 109 is dented and the surface of organic light emitting layer 109 curves concavely. If the surface of organic light emitting layer 109 curves concavely, the organic light emitting layer near the banks becomes thick and the center part of organic light emitting layer 109 becomes thin, and therefore the thickness of organic light emitting layer 109 in the sub pixel becomes non-uniform. When voltage is applied between an organic EL element having an organic light emitting layer with non-uniform thickness, only the center part of the organic light emitting layer, where the layer is thin, emits light and the light emitting layer near the banks, where the layer is thick, does not emit light. Therefore, when the thickness of the organic light emitting layer in a sub pixel is non-uniform, the aperture ratio and light emission efficiency decrease.

Further, when only the center part of the organic light emitting layer emits light, the center part of the organic light emitting layer is deteriorated severely, which result in shortening the duration of the organic EL display panel.

It is therefore an object of the present invention to provide an organic EL display panel having a high aperture ratio and long duration.

Means for Solving the Problem

The present inventors have found that it is possible to make the thickness of an organic light emitting layer uniform by making the shape of a part of a hole injection layer concavely curved or convexly curved on which the organic light emitting layer is formed, and have made the present invention by adding various other considerations.

That is, the first aspect of the present invention relates to the following organic display panel:

[1] An organic EL display panel including a substrate; linear banks placed on the substrate and defining a linear region on the substrate; and at least two organic electro luminescence elements aligned in a row in the linear region, each organic luminescence element comprising: an anode placed on the substrate; a hole injection layer made of a metal oxide and placed on the anode; an organic light emitting layer placed on the hole injection layer; and a cathode placed on the organic light emitting layer; wherein the hole injection layer is concavely curved or convexly curved; the hole injection layer is partly placed under the banks; and the organic light emitting layer is formed by applying an organic light emitting material to the linear region.

[2] The organic EL display panel described in [1] wherein the hole injection layer is concavely curved.

[3] The organic EL display panel described in [1] or [2] wherein the concavely curved hole injection layer has a depth of 50 to 300 nm.

[4] The organic EL display panel described in one of [1] to [3] wherein the banks have a forward-tapered shape.

[5] The organic EL display panel described in [4] wherein: a taper angle of the bank is 20 to 90°; a tilt angle of a tangent line at an edge of the concavely curved hole injection layer is 20 to 90 degrees as measured when the concavely curved hole injection layer is seen from a cross section which is perpendicular to a drawing direction of the linear banks.

[6] The organic EL display panel described in one of [1] to [5] wherein the metal oxide is tungsten oxide, molybdenum oxide, vanadium oxide or a combination thereof.

The second aspect of the present invention relates to the manufacturing method of the following organic display panel:

[7] A manufacturing method of an organic EL display panel includes the steps of providing a substrate; forming at least two concavely curved parts or convexly curved parts on the substrate; forming an anode on the concavely curved part or convexly curved part; forming a hole injection layer on the anode; forming linear banks defining a linear region on the substrate, the concavely curved parts or convexly curved parts being arranged in the linear region; and applying an ink containing an organic light emitting material inside the linear region to form a linear organic light emitting layer, wherein the hole injection layer is made of a metal oxide.

[8] The manufacturing method of the organic EL display panel described in [7], wherein the substrate has a photosensitive resin layer on a surface where the concavely curved parts or the convexly curved parts are formed.

Advantageous Effect of the Invention

In the organic EL display panel of the present invention, each organic EL element has an organic light emitting layer with uniform thickness, so that the light emitting area in the organic light emitting layer is large. Consequently, the organic EL display panel of the present invention has a high aperture ratio. Further, the thickness of the organic light emitting layer is uniform, so that the organic light emitting layer is deteriorated little. Consequently, the duration of the organic EL display panel of the present invention is long.

BEST MODE FOR CARRYING OUT THE INVENTION

Figure 1:
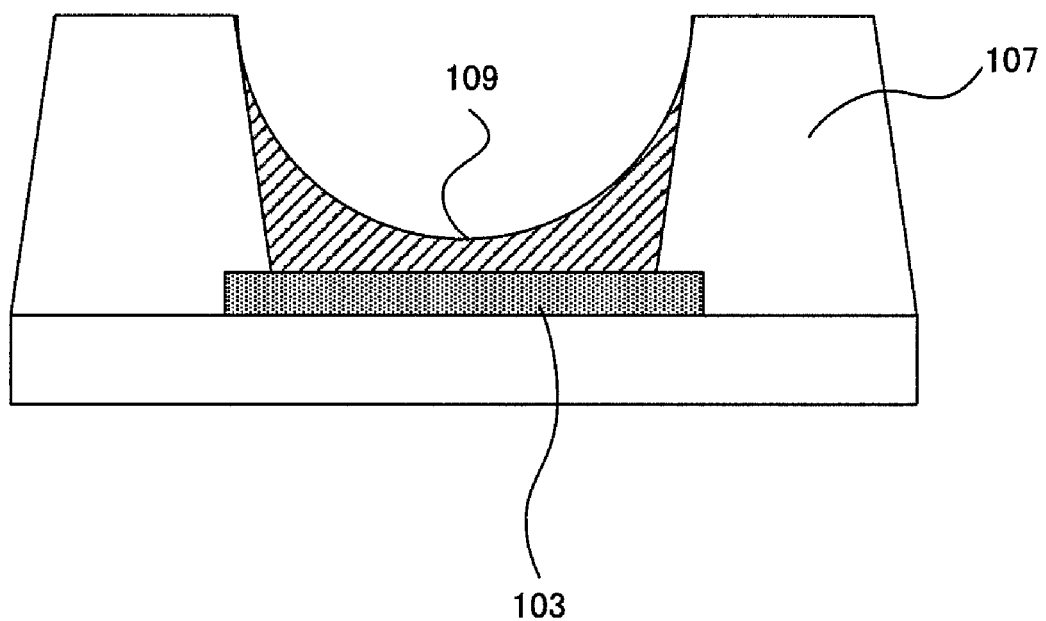
FIG. 1 is a cross-sectional view of an organic EL element included in a conventional organic EL display panel.

1. The Organic EL Display Panel of the Present Invention

The organic EL display panel of the present invention has a substrate and a plurality of linear banks defining a plurality of linear regions on the substrate. Organic EL elements are aligned in one row inside each linear region.

The feature of the organic EL display panel of the present invention lies in the shape of a hole injection layer in the organic EL element. The other configurations of the organic EL display panel of the present invention may be the same as those of known organic EL display panels as long as the effect of the present invention is not impaired. For example, the organic EL display panel of the present invention may be of a passive matrix type or of an active matrix type. Further, the organic EL display panel of the present invention may be of a bottom emission type (where light is taken out through an anode and a substrate) or top emission type (where light is taken out through a cathode and a seal film).

The material of the substrate varies depending on whether the organic EL display panel of the present invention is of a bottom emission type or of a top emission type. In the case where the organic EL display panel is of a bottom emission type, the substrate is required to be transparent, so that examples of the material of the substrate contain glass and a transparent resin such as PET (polyethylene terephthalate), PEN (polyethylene naphthalate) and PI (polyimide). On the other hand, in the case where the organic EL display panel is of a top emission type, a substrate is not required to be transparent, and any substrate material can be used as long as the material of the substrate is an insulant. Further, the substrate may have built-in driving TFTs for driving the organic EL elements.

The banks define the area for providing the organic light emitting layer of the organic EL element (described later). In the present invention, a plurality of linear banks are formed on the substrate and define linear regions on the substrate (see FIG. 5). A plurality of organic EL elements are aligned in one row in the linear region defined by the linear banks. The linear banks are preferably parallel to each other.

The height of the bank (the distance from the substrate surface to the top of the bank) is preferably from 0.5 to 2 µm. Further, the bank may have a forward-tapered shape or a reverse-tapered shape. The bank preferably has a forward-tapered shape in the case where the hole injection layer is concavely curved (described later). When the bank has a forward-tapered shape, the upper limit of the taper angle of the bank is 20 to 90°, and, more preferably, 40 to 70°. Further, the width of the bank is preferably 60 to 80 µm.

The banks preferably are lyophobic because the banks define the regions to which an ink containing an organic light emitting material (described later) is applied. To make the banks lyophobic, the banks may be subjected to plasma-treatment by fluorine gas, or may be made of a fluorine-containing resin material. The fluorine-containing resin may be a resin which has fluorine atoms in at least part of units among the polymer repeating units.

When the banks are subjected to plasma-treatment, the material of the banks may be polyimide or an acrylic resin. Particularly, polyimide is a preferable material for the banks because polyimide has low water absorption. Further, examples of a fluorine-containing resin include a fluorinated polyimide resin, a fluorinated polymethacrylic resin, a fluorine-containing phenol novolac resin, and so on.

Figure 9:
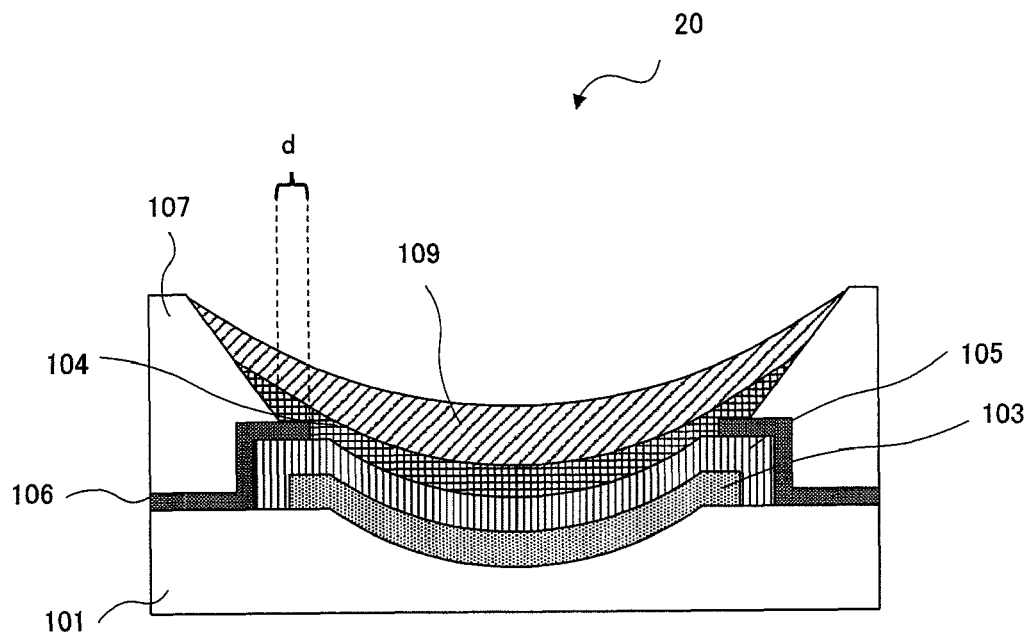
FIG. 9 is a cross-sectional view of the organic EL element included in the organic EL display panel of Embodiment 3.

In the present invention, the structure of the bank may have two layered structure (see FIG. 9). When the bank has a two layered structure, the bank is constructed of an inorganic film, which is the lower layer, and an organic layer, which is the upper layer. Examples of the material of the inorganic film include silicon oxide, silicon nitride, silicon oxide nitride and so on, which could be treated easily by etching. The thickness of the inorganic film is 10 to 100 nm. The inorganic film may protrude from the organic layer into a linear region by 1 to 10 µm. By making the inorganic film protrude from the organic layer into the linear region, it is possible to prevent the dust produced during the process of forming the organic layer from adhering to the hole injection layer (described later). As a result, it is possible to make the thickness of layers laminated on the anode uniform, so that the light emission efficiency of the organic EL display panel improves substantially.

Further, grooves or projections may be provided on the upper surface of the banks. By providing grooves or projections on the upper surface of the banks, it is possible to prevent the ink applied inside the region defined by the banks from leaking outside the banks in a more reliable manner.

The organic layer material may be polyimide, an acrylic resin and a fluorine-containing resin as described above, and the organic layer may be liquid-repellent, self-assembled monolayer (SAM). The self-assembled monolayer material preferably has a silane coupling structure at the end of the organic material. When the self-assembled monolayer material has a silane coupling structure, a self-assembled monolayer is easily formed on the inorganic film. Silane coupling bonding may be cut by radiating light such as ultraviolet rays, so that the self-assembled monolayer may be patterned by radiating light using photo-mask.

As described above, a plurality of organic EL elements are aligned in one row inside the linear region. Each organic EL element has an anode, a hole injection layer, an organic light emitting layer and a cathode. Hereinafter, individual components of the organic EL element will be explained.

[Anode]

The anode is a conductive member provided on the substrate. The material of the anode varies depending on whether the organic EL display panel of the present invention is of a bottom emission type or a top emission type. In the case where the organic EL display panel is of the bottom emission type, the anode is required to be transparent, so that examples of the material of the anode include ITO (Indium Tin Oxide), IZO (Indium Zinc Oxide) and tin oxide. On the other hand, in the case where the organic EL display panel is of a top emission type, the anode is required to reflect light, so that examples of the material of the anode include APC alloy (silver-palladium-copper alloy), ARA (silver-rubidium-gold alloy), MoCr (molybdenum-chromium alloy) and NiCr (nickel-chromium alloy). The thickness of the anode may be approximately 150 nm, and is usually 100 to 500 nm.

Further, the anode may be connected to the drain electrode of the driving TFT. In the case where the organic EL display panel of the present invention is of a bottom emission type, the driving TFT and the organic EL element are usually arranged on the same face. On the other hand, in the case where the organic EL display panel of the present invention is of a top emission type, the organic EL element may be placed over the driving TFT.

Further, in the case where the organic EL display panel of the present invention is of a passive matrix type, a plurality of organic EL elements share one of linear anodes. When the anodes are linear, the drawing direction of the linear banks preferably crosses the drawing direction of the anodes at right angles. On the other hand, when the organic EL display panel of the present invention is of an active matrix type, the anodes are provided individually per organic EL element.

[Hole Injection Layer]

The hole injection layer has a function of helping the injection of holes from the anode to the organic light emitting layer (described later). Therefore, the hole injection layer is provided between the anode and the organic light emitting layer (described later). A part (end) of the hole injection layer is provided below the bank. The end of the hole injection layer are preferably covered by the bank.

In the present invention, the hole injection layer is made of a transition metal oxide. Examples of transition metals include tungsten, molybdenum, titanium, vanadium, ruthenium, manganese, chromium, nickel, iridium, and APC alloy (silver-palladium-copper alloy), and combination thereof. The hole injection layer preferably is made of tungsten oxide ($WO_x$), vanadium oxide ($V_xO_y$) or molybdenum oxide ($MoO_x$), or combination thereof. The thickness of the hole injection layer is usually 10 to 100 nm and may be approximately 50 nm. In the organic EL display panel of the present invention, one hole injection layer may be shared by a plurality of elements, or the hole injection layers may be arranged per element individually.

Figure 10:
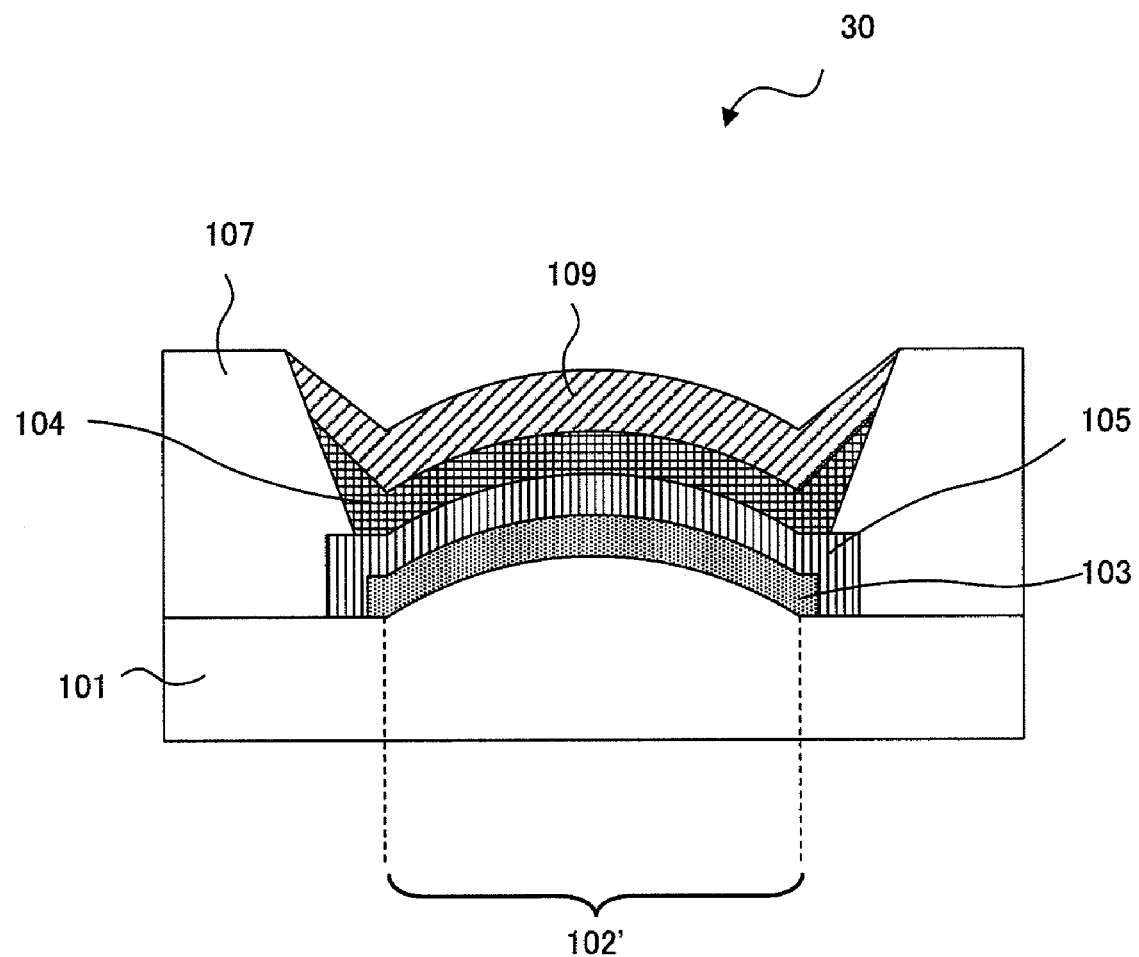
FIG. 10 is a cross-sectional view of the organic EL element included in the organic EL display panel of Embodiment 4.

A feature of the present invention lies in that the hole injection layer of each organic EL element is concavely curved (see FIG. 7) or convexly curved (see FIG. 10). The concavely curved hole injection layer means that, in the surface of the hole injection layer, the center part of the surface part contacting the organic light emitting layer (described later) is dented toward the substrate. Further, in the case of the hole injection layer is concavely curved, the surface part contacting the organic light emitting layer (described later) may be an elliptical paraboloid (see FIG. 8) or parabolic cylinder (see FIG. 6). On the other hand, the convexly curved hole injection layer means that, in the surface of the hole injection layer, the center part of the surface part contacting the organic light emitting layer (described later) is bulged toward the organic light emitting layer. Further, in the case where the hole injection layer is convexly curved, the surface part contacting the organic light emitting layer (described later) may be an ellipsoid or elliptical cylinder.

To make the hole injection layer concavely curved, for example, the hole injection layer may be formed on the concavely curved anode. The anode is concavely curved, for example, by forming concavely curved part on the substrate and by forming the anode on the concavely curved part. On the other hand, to make the hole injection layer convexly curved, for example, the hole injection layer may be formed on the convexly curved anode. The anode is convexly curved by forming convexly curved part on the substrate and by forming the anode on the convexly curved part.

The shape of the hole injection layer is selected as appropriate depending on the shape of the organic light emitting layer (described later).

Hereinafter, the shape of the hole injection layer will be explained in detail with reference to drawings.

Figure 2:
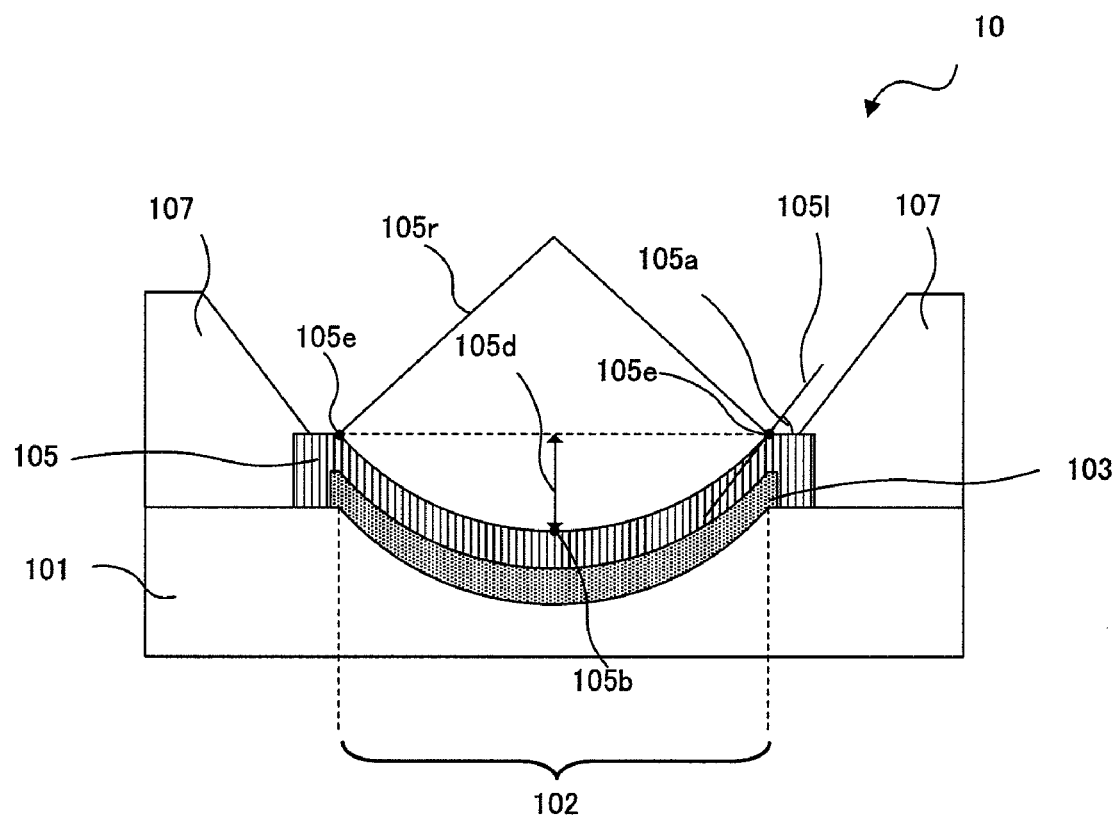
FIG. 2 is a cross-sectional view of an organic EL element included in the organic EL display panel of the present invention.

FIG. 2 shows a cross-sectional view (i.e. cross-sectional view along the A-A line in FIG. 5) perpendicular to the drawing direction of the linear banks of organic EL element 10 having a concavely curved hole injection layer. Further, in FIG. 2, the anode and the organic light emitting layer are omitted. As shown in FIG. 2, organic EL element 10 has substrate 101, anode 103, concavely curved hole injection layer 105 and bank 107.

Substrate 101 has concavely curved part 102. Concavely curved Anode 103 is set on concavely curved part 102. Concavely curved hole injection layer 105 is set on concavely curved anode 103.

As shown in FIG. 2, bank 107 preferably has a forward-tapered shape in the case where the hole injection layer is concavely curved. As described above, when bank 107 has a forward-tapered shape, the taper angle of bank 107 is 20 to 90°, and, more preferably, 40 to 70°. Tilt angle 105a of tangent line 1051 at edge 105e of concavely curved hole injection layer 105 is 20 to 90°, more preferably, 20 to 50°, and more preferably, the same extent to the taper angle of bank 107 (40 to 50°) as measured when concavely curved hole injection layer 105 is seen from a cross-section perpendicular to the drawing direction of linear banks 107.

Further, depth 105d of concavely curved hole injection layer 105 is preferably 50 to 300 nm. Here, the depth of the concavely curved hole injection layer means a distance between most dented point 105b in the surface of concavely curved hole injection layer 105 and the line linked between edges 105e of hole injection layer 105. Curvature radius 105r of concavely curved hole injection layer 105 is preferably 10 to 300 μm, and, more preferably, 60 to 80 μm.

By making the hole injection layer concavely curved or convexly curved, as mentioned above, the thickness of the organic light emitting layer (described later) is made uniform.

[Organic Light Emitting Layer]

The organic light emitting layer contains an organic light emitting material. The organic light emitting layer is provided on the hole injection layer in the region defined by the banks. The thickness of the organic light emitting layer is preferably approximately 50 to 100 nm (e.g. 70 nm).

The organic light emitting layer is arranged in the region defined by the banks. That is, the organic light emitting layer is formed linearly inside the linear region. Therefore, the organic EL elements in one linear region share one organic light emitting layer.

The organic light emitting material contained in the organic light emitting layer may be a small molecular organic light emitting material or an organic light emitting polymer material, and is preferably an organic light emitting polymer material. This is because the organic light emitting layer containing an organic light emitting polymer material can be formed easily with coating method. Examples of an organic light emitting polymer material include polyphenylenevinylene and its derivatives, polyphenylene and its derivatives, polyparaphenylene ethylene and its derivatives, poly-3-hexylthiophene (P3HT) and its derivatives, and polyfluorene (PF) and its derivatives.

The organic light emitting material is selected as appropriate so that a desired color (red, green, or blue) is generated from each sub pixel (organic EL element). For example, the green sub pixel is arranged next to the red sub pixel, the blue sub pixel is arranged next to the green sub pixel, and a red sub pixel is arranged next to the blue sub pixel. By applying an ink containing an organic light emitting material and a solvent to the region defined by the banks with a coating method such as ink-jetting, the organic light emitting layer is formed easily without damaging other component.

Further, depending on the physical properties of the ink applied, the organic light emitting layer often becomes concavely curved or convexly curved. In the present embodiment, the organic light emitting layer preferably becomes concavely curved. The physical properties of the ink having influence on the shape of the organic light emitting layer include, for example, the boiling point of the solvent and the concentration of the organic light emitting material.

As described above, the shape of the hole injection layer is selected as appropriate depending on shape of the organic light emitting layer. In the present invention, in the case where the organic light emitting layer is made concavely curved, the hole injection layer may be concavely curved, and, in the case where the organic light emitting layer is made convexly curved, the hole injection layer may be convexly curved.

In this way, with the present embodiment, by conforming the shape of the organic light emitting layer to the shape of the hole injection layer, it is possible to make the thickness of the organic light emitting layer uniform.

The interlayer may be set between the hole injection layer and the organic light emitting layer. The interlayer has a role of blocking intrusion of electrons into the hole injection layer and a role of efficiently transporting holes to the organic light emitting layer, and is made of a polyaniline material, for example. The interlayer is provided in the region defined by the banks. That is, the interlayer is formed linearly inside the linear region. Therefore, the organic EL elements in the linear region share one linear interlayer. The thickness of the interlayer is usually between 5 nm and 100 nm inclusive and is preferably between 10 nm and 50 nm inclusive (e.g. approximately 20 nm). Further, the interlayer may be omitted as long as holes are efficiently transported from the hole injection layer to the organic light emitting layer.

[Cathode]

The cathode is provided on the organic light emitting layer. The material of the cathode varies depending on whether the organic EL display panel of the present invention is of a bottom emission type or a top emission type. In the case where the organic EL display panel is of a top emission type, the cathode is required to be optically transparent. Therefore, examples of the material of the cathode include ITO, IZO, Ba, Al, WOx and so on. Further, in the case where the organic EL display panel is of a top emission type, an organic buffer layer formed with the deposition method may be provided between the organic light emitting layer and the cathode. On the other hand, in the case where the organic EL display panel of the present invention is of a bottom emission type, the material of the cathode is not particularly limited, and, for example, Ba, BaO, and Al.

Further, in the case where the organic EL display panel is an active matrix type, all the organic EL elements may share one cathode (see FIG. 4), because each sub pixel is driven by separate TFTs in an active matrix type organic EL display panel. On the other hand, in the case where the organic EL display panel is a passive matrix type, a plurality of linear cathodes are arranged on the panel. In this case, the linear banks can function as a cathode separator. Further the drawing direction of the linear cathodes preferably crosses the drawing direction of the linear anodes at right angles.

The organic EL display panel may be sealed by providing a cover material (sealing material) on the cathode. By the cover material, it is possible to reduce intrusion of moisture and oxygen into the organic light emitting layer.

In the organic EL display panel of the present invention, an organic EL element has an organic light emitting layer with uniform thickness, so that the light emitting area in the organic light emitting layer is large. Consequently, the organic EL display panel of the present invention has a high aperture ratio. Further, by making the thickness of the organic light emitting layer uniform, the organic light emitting layer will be deteriorated little. Therefore, the duration of the organic EL display panel of the present invention is long.

2. The Manufacturing Method of the Organic EL Display Panel

The organic EL display panel of the present invention may be manufactured by any method as long as the effect of the present invention is not impaired.

Figure 3A:
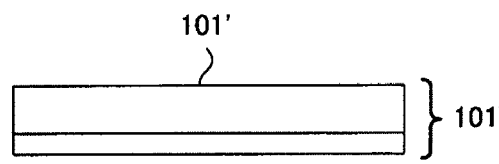
FIG. 3 illustrates a manufacturing method of the organic EL display panel of the present invention.
Figure 3B:
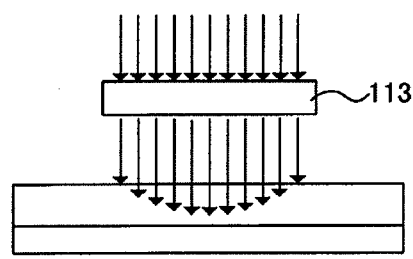
Figure 3C:
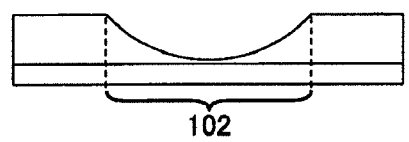
Figure 3D:
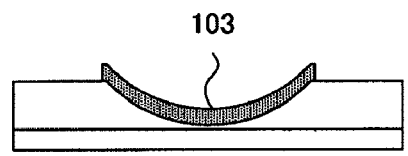
Figure 3E:
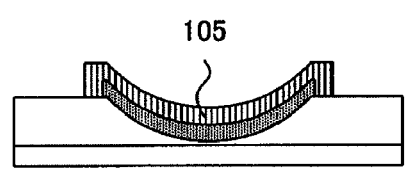
Figure 3F:
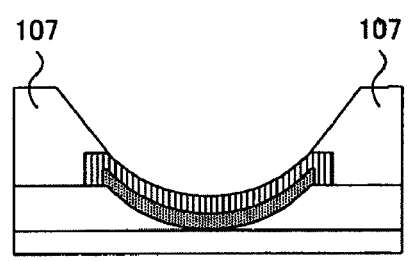

The preferable manufacturing method of the organic EL display panel includes, for example: (1) the first step of providing a substrate (FIG. 3A); (2) a second step of forming two or more concavely curved parts or convexly curved parts (FIGS. 3B and 3C); (3) a third step of forming an anode on the concavely curved part or convexly curved part on the substrate (FIG. 3D); (4) a fourth step of forming a concavely curved or convexly curved hole injection layer on the anode (FIG. 3E); (5) a fifth step of forming linear banks (FIG. 3F); (6) a sixth step of applying an ink containing an organic light emitting material in the region defined by the banks (i.e. linear region) to form an organic light emitting layer (FIGS. 3G and 3H); and (7) a seventh step of forming a cathode on the organic light emitting layer (FIG. 3I).

In order to form concavely curved parts or the convexly curved parts on the substrate in the second step, the substrate may be directly subjected to wet etching or dry etching, or a photosensitive resin layer may be exposed and developed, which is laminated on the substrate surface which is formed to be the concavely curved parts or the convexly curved parts. As described above, whether to make the hole injection layer concavely curved or convexly curved, that is, whether to form the concavely curved parts or convexly curved parts on the substrate is selected depending on the shape of the organic light emitting layer to be formed.

Hereinafter, the manufacturing method of the organic EL display panel of the present invention will be explained with reference to accompanying drawings in the case where the organic light emitting layer and hole injection layer are concavely curved.

FIG. 3A shows the first step. In the first step, substrate 101 is provided. Substrate 101 has photosensitive resin layer 101'. Substrate 101 may have built-in driving TFTs.

FIGS. 3B and 3C show the second step. In the second step, concavely curved part 102 is formed on substrate 101. To form concavely curved part 102 on substrate 101, a positive photoresist is selected as the material of photosensitive resin layer 101' of substrate 101, and, photosensitive resin layer 101' may be exposed using mesh mask 113 in which the opening ratio near the center is higher than the opening ratio near the periphery, as shown in FIG. 3B. After that, by developing the substrate, it is possible to obtain substrate 101 on which concavely curved part 102 is formed.

FIG. 3D shows the third step. In the third step, anode 103 is formed on concavely curved part 102 on substrate 101. Anode 103 may be formed by forming a film made of the materials of anode 103 on concavely curved part 102 on substrate 101 with sputtering or the like, and by patterning the formed layer with etching.

FIG. 3E shows the fourth step. In the fourth step, hole injection layer 105 is formed on anode 103. Hole injection layer 105 is formed by forming a film made of the materials of hole injection layer 105 on concavely curved anode 103 with sputtering or the like and by patterning the layer with etching. By forming hole injection layer 105 on concavely curved anode 103 with sputtering or the like as mentioned above, concavely curved hole injection layer 105 can be obtained.

FIG. 3F shows the fifth step. In the fifth step, linear banks 107 are formed. Banks 107 may be formed with photolithography or printing technologies.

Formation of banks using the photolithography technologies includes the steps of (a) forming film of a photosensitive resin composition containing a resin on substrate 101 and hole injection layer 105 (b) exposing and developing the film so as to expose at least part of hole injection layer 105.

A film of a photosensitive resin composition containing a resin on substrate 101 and hole injection layer 105 is formed by, for example, applying a resin composition using spin-coating, forming a film made of the resin composition; and drying the film made of the resin composition. The drying condition is not particularly limited, and the films may be left for 2 to 3 minutes at 80° C.

By exposing and developing the film of the photosensitive resin composition containing the resin, hole injection layer 105 is exposed in the linear region in which the ink containing the organic light emitting material (described later) is to be applied.

The developed film is subjected to baking treatment. Although the condition of the baking treatment is not particularly limited, the temperature is approximately 200° C. or more and the time period is approximately one hour, for example.

On the other hand, the printing technology, a technique such as intaglio printing, relief printing or the like may be used to form a patterned resin film. If banks 107 are formed by intaglio printing or the like, other component members will be damaged little.

The manufacturing method of the organic EL display panel of the present invention may include a step of forming an inorganic film between the fourth step and fifth step. The inorganic film is formed with inorganic material using the CVD method. The formed inorganic film may be subject to dry-etching with gas including SiF and $CF_4$ to be patterned.

Figure 3G:
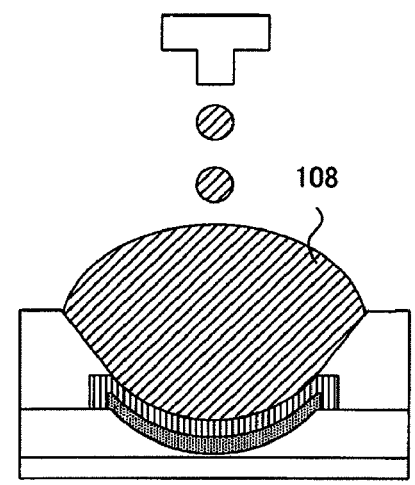
Figure 3H:
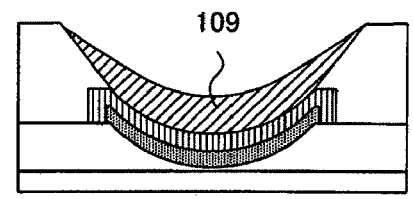
Figure 3I:
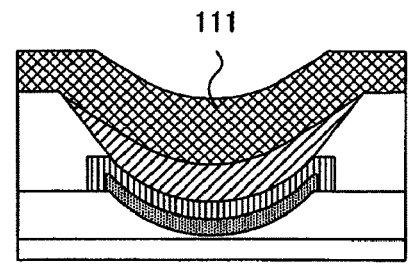

FIGS. 3G and 3H show the sixth step. In the sixth step, organic light emitting layer 109 is formed on hole injection layer 105. Organic light emitting layer 109 is formed by applying ink 108 containing an organic light emitting material and solvent to the region defined by banks 107 (i.e. linear region) (FIG. 3G), and by drying the ink applied. Examples of the solvent include an aromatic system solvent, for example, anisole. The applying means is not particularly limited. Examples of the applying means include ink-jet, dispenser, nozzle coating, spin coating intaglio printing, relief printing or the like. The preferable applying means is ink-jet.

Organic light emitting layer 109 formed by drying ink 108 becomes concavely curved. Therefore, when the region on which organic light emitting layer 109 is formed is flat, the thickness of organic light emitting layer 109 of each organic EL element 10 will become non-uniform (see FIG. 1).

However, in the present invention, hole injection layer 105 in the region in which organic light emitting layer 109 is formed is also concavely curved. Consequently, even if organic light emitting layer 109 becomes concavely curved, the thickness of organic light emitting layer 109 on hole injection layer 105 is uniform.

The manufacturing method of the present invention may have a step of forming an interlayer between the fifth step and the sixth step. The interlayer is formed by applying ink containing the material of the interlayer and solvent to the region defined by the banks.

FIG. 3I shows the seventh step. In the seventh step, cathode 111 is formed on organic light emitting layer 109. Cathode 111 is formed with, for example, the deposition method or sputtering. After that, a seal film may be formed on the cathode to prevent moisture or oxygen from intruding into organic light emitting layer.

In this way, with the manufacturing method of the organic EL display panel of the present invention, it is possible to make the thickness of the organic light emitting layer in the organic EL element uniform, so that the aperture ratio of the organic EL display panel improves and the light emission efficiency improves. Further, when the thickness of the organic light emitting layer is uniform, it is possible to extend the life of an organic EL display panel and reduce power consumption.

Hereinafter, embodiments of the present invention will be described with reference to the accompanying drawings. However, the present invention is not limited to these embodiments.

Embodiment 1

In Embodiment 1, an active matrix type organic EL display panel will be described.

Figure 4:
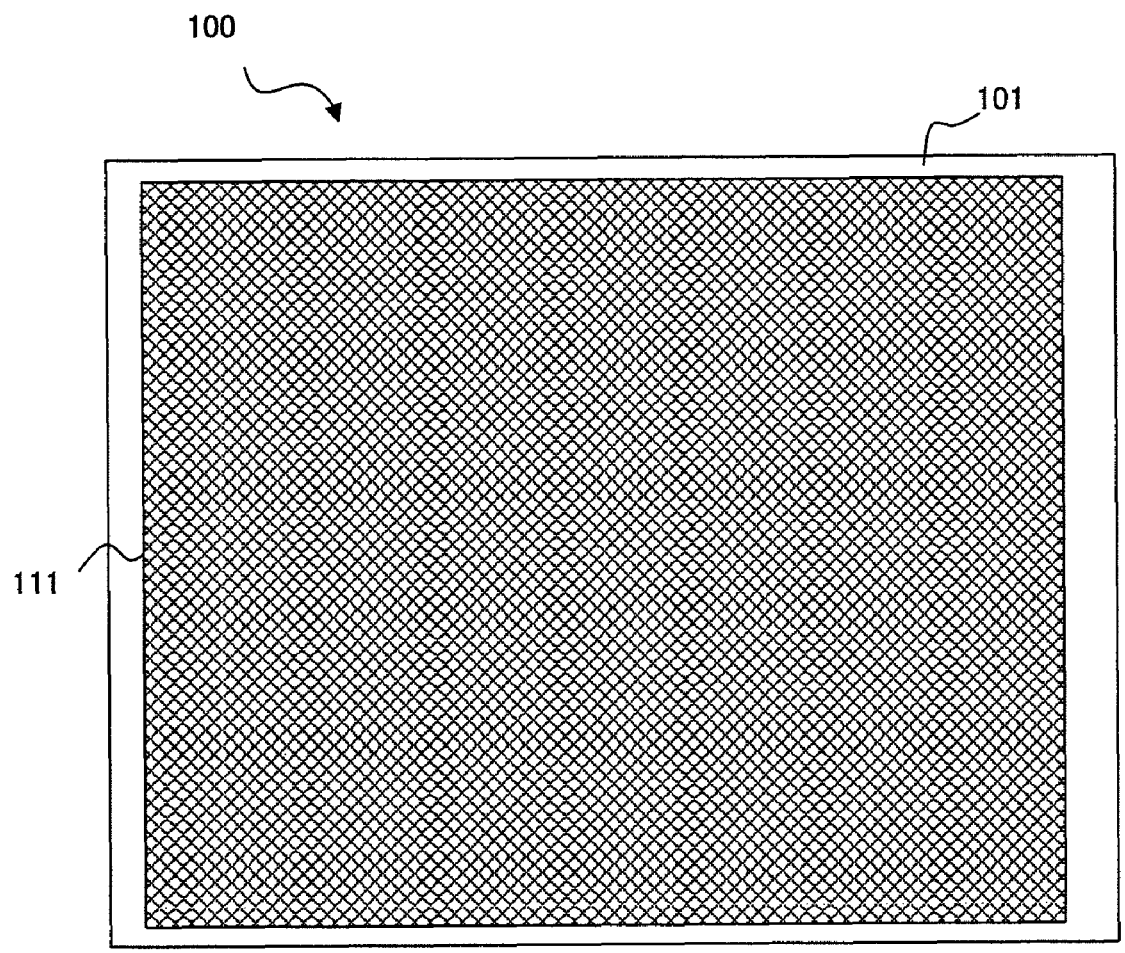
FIG. 4 is a plan view of the organic EL display panel of Embodiment 1.

FIG. 4 is a plan view of organic EL display panel in Embodiment 1. As shown in FIG. 4, organic EL display panel 100 has cathode 111 covering the entire panel.

Figure 5:
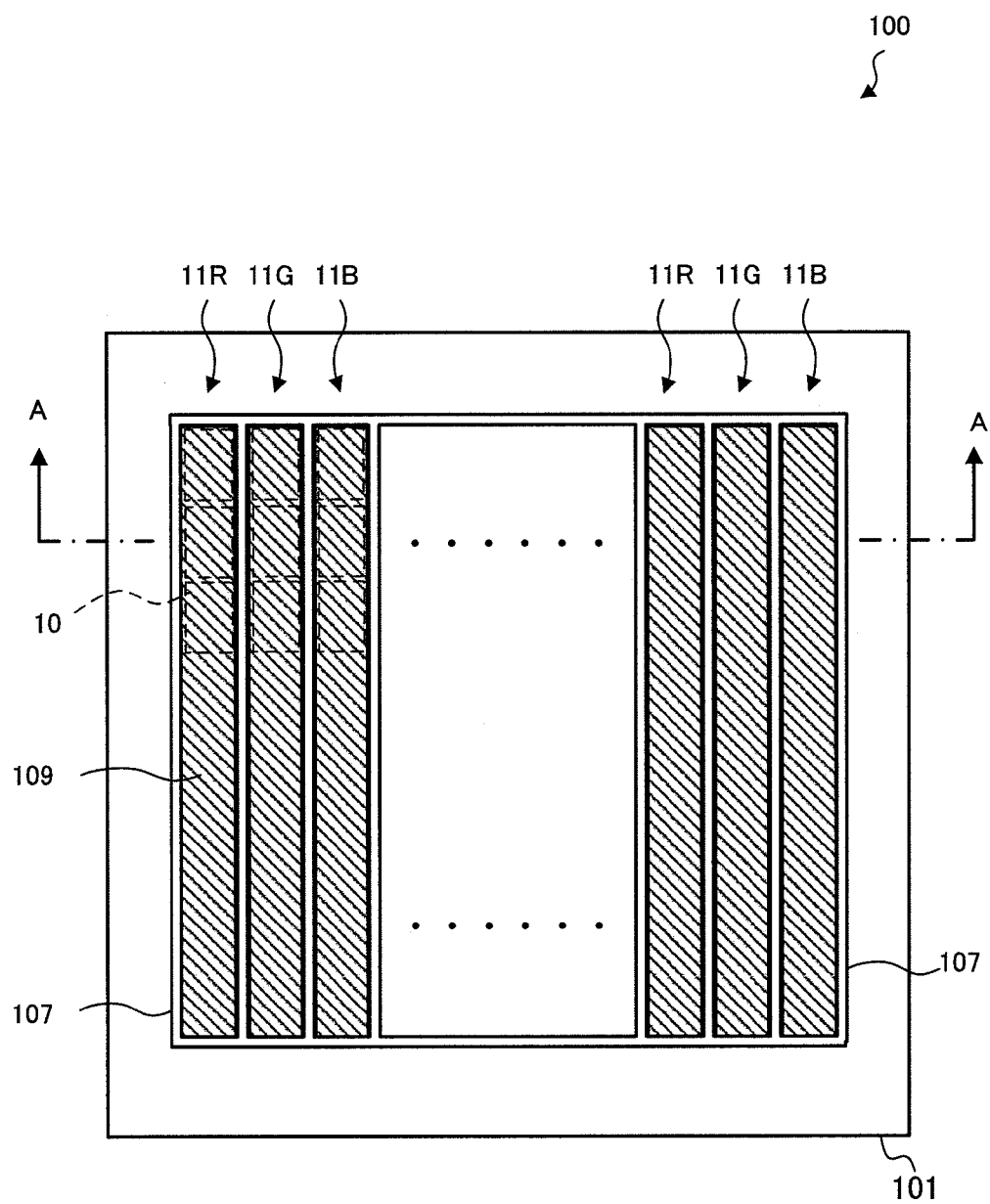
FIG. 5 is a plan view of the organic EL display panel of Embodiment 1.

FIG. 5 is a plan view of organic EL display panel 100 omitting cathode 111. As shown in FIG. 5, organic EL display panel 100 has linear banks 107 aligned in parallel to each other on substrate 101. Linear banks 107 define linear regions 11. A plurality of organic EL elements 10 are aligned in one row in linear region 11. Organic light emitting layer 109 is arranged linearly in linear region 11. Organic EL elements 10 aligned in linear region 11 share linear organic light emitting layer 109.

Organic EL elements 10 aligned in linear region 11R emit red light, organic EL elements 10 aligned in linear region 11G emit green light and organic EL elements 10 aligned in linear region 11B emit blue light. Linear regions 11 are each defined by the banks, and therefore the inks applied in the regions will not become mixed. Further, by forming the organic light emitting layer linearly, the thickness of the organic light emitting layer becomes uniform in the linear direction.

Figure 6:
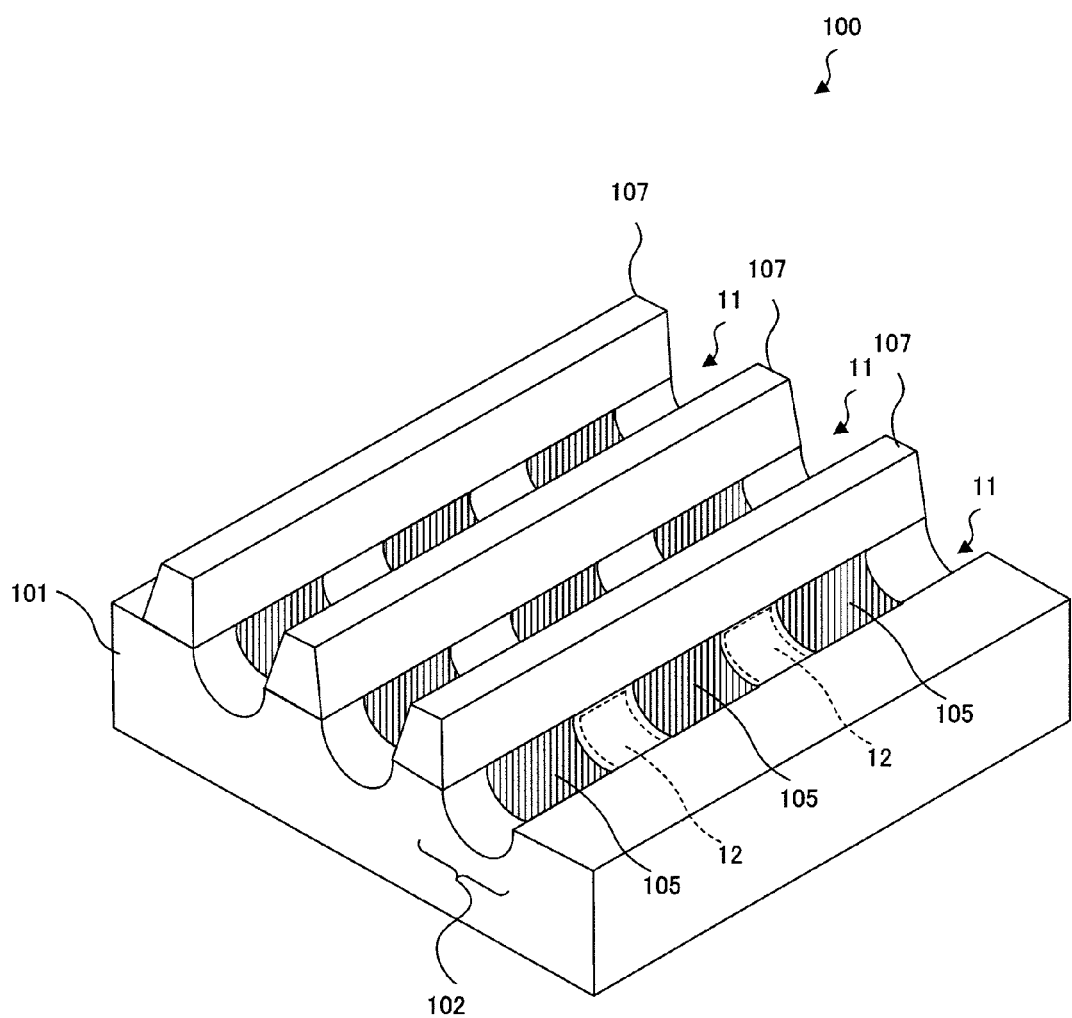
FIG. 6 is a perspective view of the organic EL display panel of Embodiment 1.

FIG. 6 is a perspective view of organic EL display panel 100 omitting cathode 111, organic light emitting layer 109 and interlayer 104 from organic EL display panel shown in FIG. 5. As shown in FIG. 6, substrate 101 has convexly curved parts 102 in the shape of a parabolic cylinder. Anode 103 and hole injection layer 105 are formed on concavely curved part 102, so that, in the present embodiment, hole injection layer 105 is concavely curved, and the surface of hole injection layer 105 contacting the organic light emitting layer has a shape of a parabolic cylinder. Further, the surface of region 12 between the organic EL elements has a shape of a parabolic cylinder. By making region 12 between the organic EL elements concavely curved, even when foreign substances such as particles are intruded on region 12 before forming the organic light emitting layer, it is possible to hold foreign substances in region 12 and prevent foreign substances from intruding on organic EL element. Hereinafter, the organic EL element included in organic EL display panel 100 of Embodiment 1 will be described in detail.

Figure 7:
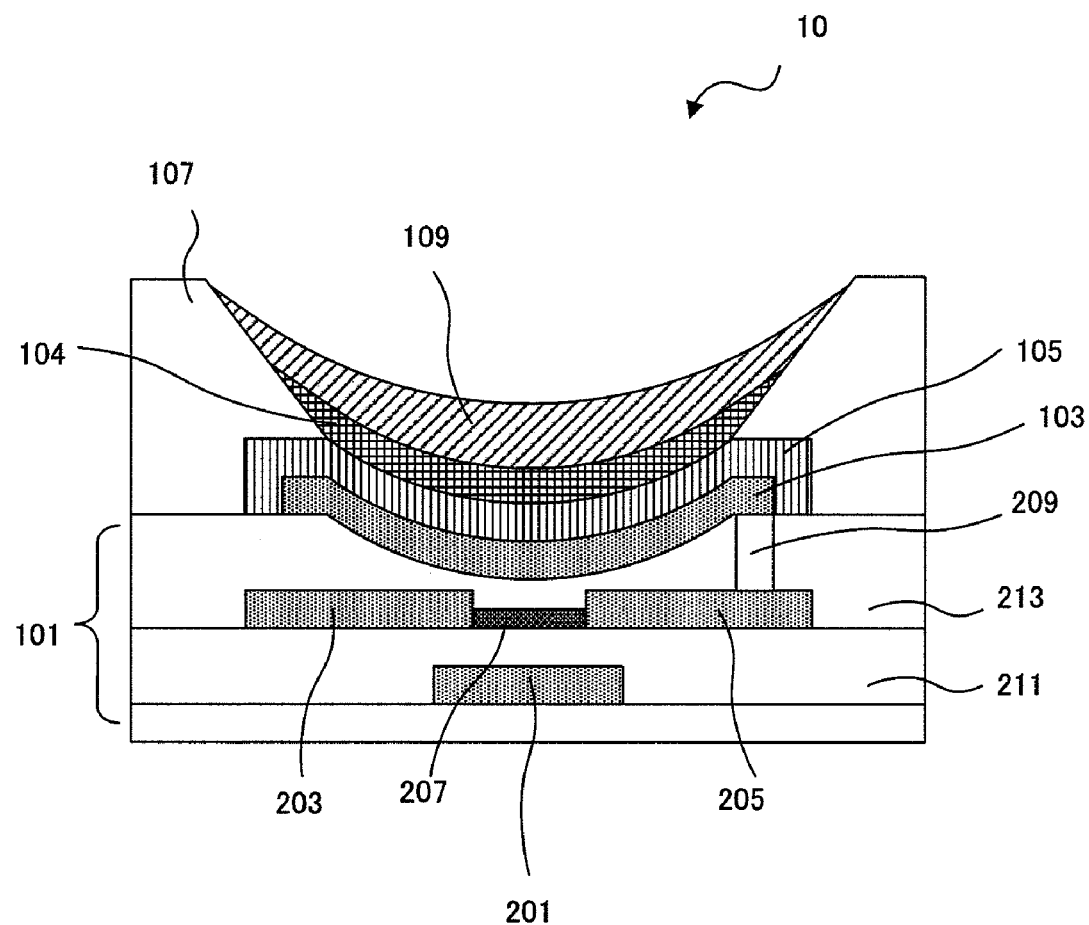
FIG. 7 is a cross-sectional view of the organic EL element included in the organic EL display panel of Embodiment 1.

FIG. 7 shows organic EL element 10 of cross-sectional view of organic EL display panel 100 along A-A line shown in FIG. 5. Organic EL element 10 has substrate 101, anode 103, hole injection layer 105, banks 107, interlayer 104 and organic light emitting layer 109.

Substrate 101 has built-in driving TFTs. Substrate 101 has gate electrode 201, source electrode 203 and drain electrode 205. Gate insulating film 211 insulates gate electrode 201 from source electrode 203 and drain electrode 205. Channel 207 connects source electrode 203 and drain electrode 205. Further, flattening film 213 is placed over channel 207, source electrode 203 and drain electrode 205. Drain electrode 205 and anode 103 are connected via contact hole 209.

As shown in FIG. 7, anode 103 and hole injection layer 105 is concavely curved. By making hole injection layer 105 concavely curved as mentioned above, the thickness of interlayer 104 and organic light emitting layer 109 formed on hole injection layer with coating method 105 becomes uniform.

In this way, in the present embodiment, the thickness of organic light emitting layer is uniform. Further, it is possible to reduce the decrease of the yield caused by particles.

Embodiment 2

In Embodiment 1, the case is explained where the surface of the concavely curved hole injection layer has a shape of a parabolic cylinder. In Embodiment 2, a case will be explained with an example where the surface of concavely curved the hole injection layer has a shape of an elliptical paraboloid.

Figure 8:
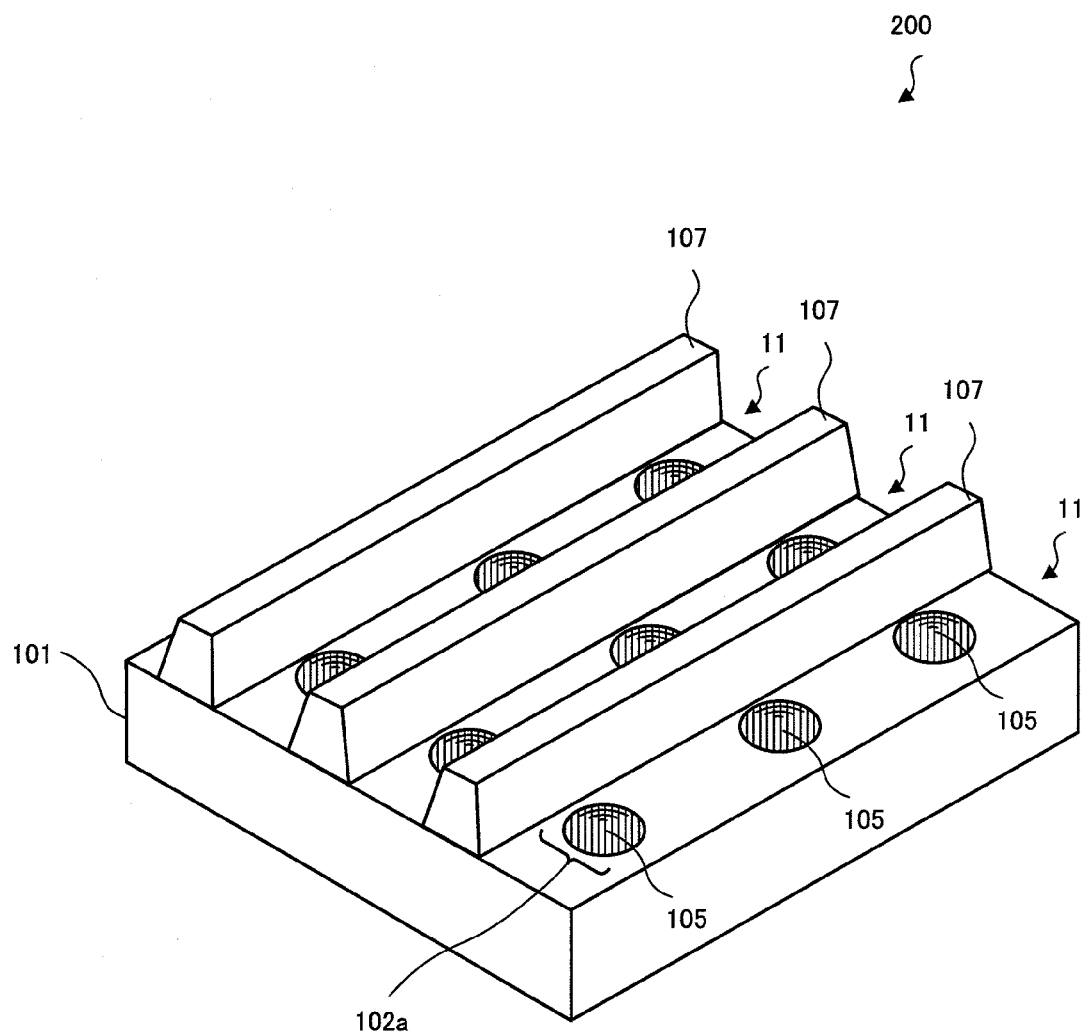
FIG. 8 is a perspective view of the organic EL display panel of Embodiment 2.

FIG. 8 is a perspective view of organic EL display panel 200 of Embodiment 2 omitting the cathode, the organic light emitting layer and the interlayer. Organic EL display panel 200 is the same as organic EL display panel 100 except the shape of concavely curved part 102a substrate 101 has. Therefore, the same reference numerals are assigned to the same components as in organic EL display panel 100 and the explanation thereof will be omitted.

As shown in FIG. 8, substrate 101 has concavely curved parts 102a aligned in a row in linear region 11. The surface of concavely curved part 102a has a shape of an elliptical paraboloid. In Embodiment 2, each organic EL element is formed on concavely curved part 102a. Therefore, the hole injection layer of each organic EL element is concavely curved and the surface of the hole injection layer has a shape of an elliptical paraboloid.

In the present embodiment, each surface of the concavely curved hole injection layer has a shape of an elliptical paraboloid, so that it is possible to make the thickness of the organic light emitting layer uniform and improve the aperture ratio.

Embodiment 3

With Embodiments 1 and 2, examples where the bank has a one-layered structure are explained. With Embodiment 3, an example where the bank has a two-layered structure will be explained.

A plane view of the organic EL display panel of Embodiment 3 is the same as of organic EL display panel 100 shown in FIGS. 4 and 5 of Embodiment 1.

FIG. 9 is a cross-sectional view of organic EL element 20 included in organic EL display panel of Embodiment 3. Organic EL element 20 is the same as organic EL element 10 other than having an inorganic film. Therefore, the same reference numerals are assigned to the same components as in organic EL element 10 and the explanation thereof will be omitted.

As shown in FIG. 9, organic EL element 20 has inorganic film 106 placed under bank 107. Inorganic film 106 is placed on substrate 101 such that inorganic film cover the end of hole injection layer 105. Further, inorganic film 106 protrudes from bank 107 into the region defined by banks 107. The width d of inorganic film 106 protruded from banks 107 is 1 to 10 µm.

By providing high lyophilic inorganic film under the organic bank as mentioned above, it is possible to apply an ink to the edge of the region defined by banks, so that no area is left unapplied. This makes it possible to prevent organic EL elements from shorting.

By making inorganic film protrude from an organic layer into the linear region, it is possible to prevent the dust produced during the process of forming the organic layer from adhering to a hole injection layer. As a result, it is possible to make the thickness of layers piled over an anode uniform, so that the light emission efficiency of the organic EL display panel improves substantially.

Embodiment 4

In Embodiments 1 to 3, examples where the hole injection layer is concavely curved are explained. In Embodiment 4, an example where the hole injection layer is convexly curved will be explained. That is, a case will explained where the organic light emitting layer becomes convexly curved.

A plan view of the organic EL display panel of Embodiment 4 is the same as of organic EL display panel 100 shown in FIGS. 4 and 5 of Embodiment 1.

FIG. 10 is a cross-sectional view of organic EL element 30 included in organic EL display panel of Embodiment 4. As shown in FIG. 10, organic EL element 30 has substrate 101, anode 103, hole injection layer 105, banks 107, interlayer 104 and organic light emitting layer 109. A feature of the present embodiment includes that anode 103 and hole injection layer 105 are convexly curved. Further, substrate 101 has convexly curved part 102'.

Hereinafter, the manufacturing method of the organic EL display panel of Embodiment 4 will be explained with reference to the accompanying drawings.

FIG. 11 shows a manufacturing process of organic EL display panel in Embodiment 4. As shown in FIG. 11, the manufacturing method of the organic EL display panel in Embodiment 4 includes: (1) the first step of providing substrate 101 (FIG. 11A); (2) a second step of forming convexly curved part 102' on substrate 101 (FIGS. 11B and 11C); (3) a third step of forming anode 103 on convexly curved part 102' on substrate 101 (FIG. 11D); (4) a fourth step of forming convexly curved hole injection layer 105 on anode 103 (FIG. 11E); (5) a fifth step of forming banks 107 (FIG. 11F); and (6) a sixth step of forming interlayer 104 and organic light emitting layer 109 inside the region defined by banks 107 (FIG. 11G).

Figure 11A:
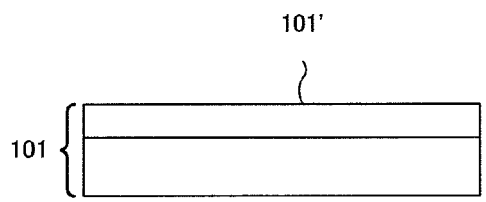
FIG. 11 illustrates a manufacturing method of the organic EL display panel of Embodiment 4.
Figure 11E:
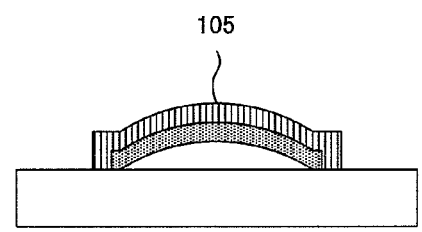
Figure 11B:
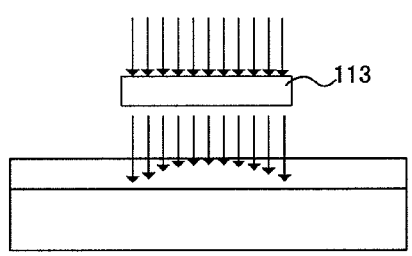
Figure 11F:
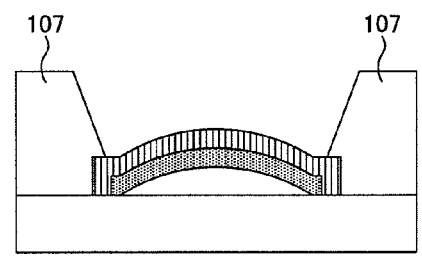
Figure 11C:
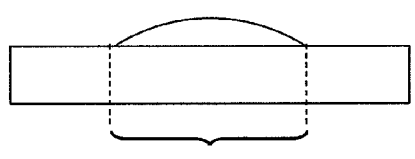
Figure 11G:
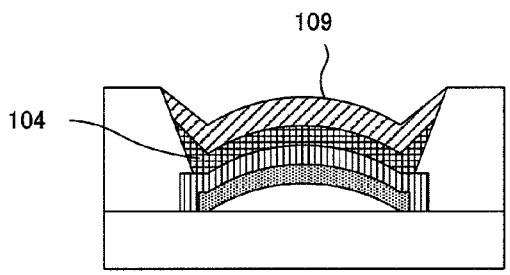
Figure 11D:
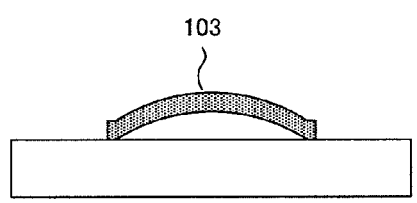

In the second step, in order to form convexly curved part 102' on substrate 101, positive photoresist is selected as the material of photosensitive resin layer 101' of substrate 101 and photosensitive resin layer 101' may be exposed using mesh mask 113 in which the opening ratio near the center is lower than the opening ratio near the periphery, as shown in FIG. 11B. After that, by developing the substrate, substrate 101 can be obtained on which convexly curved part 102' is formed.

By making a hole injection layer convexly curved, it is possible to acquire an organic light emitting layer with uniform thickness even when the light emitting layer becomes convexly curved.

The disclosure of Japanese Patent Application No. 2008-047043, filed on Feb. 28, 2008, including the specification, drawings and abstract, is incorporated herein by reference in its entirety.

INDUSTRIAL APPLICABILITY

The organic EL display panel of the present invention is applicable to, for example, organic EL displays (e.g. large screen televisions and monitors of information equipments including mobile phones).

EXPLANATION OF REFERENCE NUMERALS

101 SUBSTRATE
103 ANODE
104 INTERLAYER
105 HOLE INJECTION LAYER
106 INORGANIC FILM
107 BANK
108 INK
109 ORGANIC LIGHT EMITTING LAYER
111 CATHODE
113 MASK
201 GATE ELECTRODE
203 SOURCE ELECTRODE
205 DRAIN ELECTRODE

207 CHANNEL
209 CONTACT HOLE
211 GATE INSULATING FILM
213 FLATTENING FILM

The invention claimed is:

1. An organic electro luminescence display panel comprising:
    a substrate;
    a linear bank placed on the substrate and defining a linear region on the substrate; and
    at least two organic electro luminescence elements aligned in a row in the linear region, each organic luminescence element including:
        an anode placed on the substrate;
        a hole injection layer made of a metal oxide and placed on the anode;
        an organic light emitting layer placed on the hole injection layer; and
        a cathode placed on the organic light emitting layer;
    wherein the hole injection layer is concavely curved or convexly curved;
    an end of the hole injection layer is covered by the bank; and
    the organic light emitting layer is formed by applying an organic light emitting material to the linear region.

2. The organic electro luminescence display panel according to claim 1, wherein the hole injection layer is concavely curved.

3. The organic electro luminescence display panel according to claim 2, wherein the concavely curved hole injection layer has a depth of 50 to 300 nanometers.

4. The organic electro luminescence display panel according to claim 2, wherein the bank has a forward-tapered shape.

5. The organic electro luminescence display panel according to claim 4, wherein:
    a taper angle of the bank is 20 to 90 degrees;
    a tilt angle of a tangent line at an edge of the concavely curved hole injection layer is 20 to 90 degrees as measured when the concavely curved hole injection layer is seen from a cross section which is perpendicular to a drawing direction of the linear bank.

6. The organic electro luminescence display panel according to claim 1, wherein the metal oxide is tungsten oxide, molybdenum oxide, vanadium oxide or a combination thereof.

7. A manufacturing method of an organic electro luminescence display panel comprising the steps of:
    providing a substrate;
    forming at least two concavely curved parts or convexly curved parts on the substrate;
    forming an anode on the concavely curved part or the convexly curved part;
    forming a concavely curved or convexly curved hole injection layer on the anode;
    forming a linear bank defining a linear region on the substrate, the bank covering an end of the hole injection layer, the two or more concavely curved parts or the convexly curved parts being arranged in the linear region; and
    applying an ink containing an organic light emitting material to the linear region to form a linear organic light emitting layer, wherein
    the hole injection layer is made of a metal oxide.

8. The manufacturing method of an organic electro luminescence display panel according to claim 7, wherein the substrate has a photosensitive resin layer on a surface where the concavely curved parts or the convexly curved parts are formed.

* * * * *